United States Patent
Kim et al.

(10) Patent No.: US 12,409,486 B2
(45) Date of Patent: Sep. 9, 2025

(54) HEAT SINK MANUFACTURING METHOD

(71) Applicant: HEAT SOL CORP., Incheon (KR)

(72) Inventors: Heon Chang Kim, Seongnam-si (KR); Byung Soo Park, Incheon (KR); Sung Shin Baik, Incheon (KR); Jun Feng Li, Seoul (KR); Ji Un Hong, Wonju-si (KR)

(73) Assignee: HEAT SOL CORP., Incheon (KR)

( * ) Notice: Subject to any disclaimer, the term of this patent is extended or adjusted under 35 U.S.C. 154(b) by 0 days.

(21) Appl. No.: 18/716,910

(22) PCT Filed: Dec. 13, 2022

(86) PCT No.: PCT/KR2022/020190
§ 371 (c)(1),
(2) Date: Jun. 5, 2024

(87) PCT Pub. No.: WO2023/113416
PCT Pub. Date: Jun. 22, 2023

(65) Prior Publication Data
US 2025/0050408 A1 Feb. 13, 2025

(30) Foreign Application Priority Data
Dec. 13, 2021 (KR) .......... 10-2021-0177687

(51) Int. Cl.
*B21D 53/02* (2006.01)
*B21J 5/06* (2006.01)

(52) U.S. Cl.
CPC .......... *B21D 53/022* (2013.01); *B21J 5/068* (2020.08)

(58) Field of Classification Search
CPC .... B21D 53/022; B21J 5/068; B23P 2700/10; B26D 3/122; F28F 3/048
See application file for complete search history.

(56) References Cited

U.S. PATENT DOCUMENTS

| | | | |
|---|---|---|---|
| 6,341,651 B1 * | 1/2002 | Ohta | B23P 15/26 165/181 |
| 8,964,190 B2 * | 2/2015 | Tanaka | H01L 21/681 356/399 |
| 2005/0257914 A1 * | 11/2005 | Huang | F28F 1/16 257/E23.103 |

FOREIGN PATENT DOCUMENTS

| | | | |
|---|---|---|---|
| JP | 2010245357 A | * | 10/2010 |
| JP | 2011243933 A | | 12/2011 |

(Continued)

OTHER PUBLICATIONS

English Machine Translation of JP_2010245357_A (Year: 2010).*
(Continued)

*Primary Examiner* — Sarang Afzali
(74) *Attorney, Agent, or Firm* — The Roy Gross Law Firm, LLC; Roy D. Gross

(57) ABSTRACT

Disclosed is a heat sink manufacturing method including the steps of: determining at least one cutting line in one direction from one side point on the processing surface; individually deriving fin-specific forward and backward lengths of the skiving cutter according to the separation distance of the at least one cutting line separated from the one side point; separating, on the basis of the fin-specific forward and backward lengths, at least one auxiliary fin and one main fin from the object by sequentially moving the skiving cutter forward and backward along the at least one cutting line; and processing the one main fin so that same stands upright relative to a base plate on which the object is stacked, so as to manufacture a heat sink formed in the shape of a plurality of fins branching upward from the one main fin.

4 Claims, 7 Drawing Sheets

(56) References Cited

FOREIGN PATENT DOCUMENTS

| | | | |
|---|---|---|---|
| JP | 2018117107 | A | 7/2018 |
| JP | 2019169691 | A | 10/2019 |
| KR | 20130021635 | A | 3/2013 |
| KR | 20150124617 | A | 11/2015 |
| KR | 102377051 | B1 | 3/2022 |

OTHER PUBLICATIONS

PCT International Search Report for International Application No. PCT/KR2022/020190, mailed Mar. 20, 2023, 7pp.
PCT Written Opinion for International Application No. PCT/KR2022/020190, mailed Mar. 20, 2023, 3pp.

* cited by examiner (a)

(b)

(a)

(b)

HEAT SINK MANUFACTURING METHOD

This application is a National Phase of PCT Patent Application No. PCT/KR2022/020190 having International filing date of Dec. 13, 2022, which claims the benefit of priority of Korean Patent Application No. 10-2021-0177687, filed Dec. 13, 2021, the contents of which are all incorporated herein by reference in their entirety.

TECHNICAL FIELD

The present invention relates to a method and a system for manufacturing a heat sink, and more specifically, to a method and a system for manufacturing a heat sink to provide support such that a heat sink with enhanced heat dissipation efficiency may be rapidly and efficiently manufactured.

BACKGROUND ART

The heat sink is a device (e.g., a heat sink) that effectively discharges heat generated from a heating element using natural convection or forced convection to prevent the heating element from being excessively overheated.

The conventional heat sink is manufactured by attaching an extrusion material or fins to the extrusion material, and in this case, there is no problem if the size of the heat sink is large or the mounting space of the heat sink is large, but in order for the heating element to be small and the heat sink to be compactly designed, it is difficult to expect sufficient heat dissipation characteristics from the extrusion material itself.

That is, due to the technical limitations of the extrusion material, there is a limitation in maximizing a heat dissipation area by reducing the thickness of the fin, improving a tongue ratio, and increasing the number of fins.

To overcome these disadvantages, a skive-type heat sink has been developed. In the case of a skive-type heat sink, it is possible to manufacture the fin much thinner than the extrusion material and to easily adjust a pitch interval.

However, in the case of the conventional skive-type heat sink, it is difficult to obtain an additional heat dissipation area, and thermal interference between the fins disposed at minimum intervals frequently occurs, so that a phenomenon of heat partial stagnation may not be prevented.

DISCLOSURE

Technical Problem

To solve the above problems, an object of the present invention is to provide a method and a system for manufacturing a heat sink capable of rapidly and efficiently manufacturing the heat sink having excellent heat dissipation area efficiency.

The above and other objects and advantages of the present invention will become apparent from the following description describing preferred embodiments.

Technical Solution

To achieve the above-object, a method for manufacturing a heat sink for processing a target object using a skiving cutter according to one embodiment of the present invention includes: determining, based on information about an angle formed by the skiving cutter and a processing surface of the target object, at least one cutting line along one direction from one side point of the processing surface; individually deriving, based on material properties of the target object and a shape of the heat sink to be manufactured, fin-specific forward and backward movement lengths of the skiving cutter according to a separation distance of the at least one cutting line from the one side point; separating, based on the fin-specific forward and backward movement lengths, at least one auxiliary fin and one main fin from the target object by sequentially moving the skiving cutter forward and backward along the at least one cutting line; and processing the one main fin such that the one min fin stands upright with respect to a base plate on which the target object is stacked, so as to manufacture the heat sink formed in a shape of a plurality of fins branching upward from the one main fin.

In the embodiment, the determining may include: confirming whether the target object is disposed on a stacked surface of the base plate in parallel to the stacked surface of the base plate through a camera; and adjusting the base plate such that the base plate is inclined at a specific angle in order to allow the processing surface of the target object to be directed to the skiving cutter.

In the embodiment, the determining may include determining a number of the at least one cutting line based on a number of auxiliary fins identified according to a specific shape of the heat sink to be manufactured.

In the embodiment, the deriving may include: extracting predetermined fin separation ratio information according to the material properties of the target object; extracting target length information about at least two auxiliary fins when the heat sink is selected to have a tree fin shape; selecting target length information about the main fin based on the target length information about the at least two auxiliary fins; calculating a forward and backward movement length for an auxiliary fin by multiplying the fin separation ration information by the target length information about the at least two auxiliary fins, and calculating a forward and backward movement length of the main fin by multiplying the fin separation ration information by the target length information about the main fin; and matching the forward and backward movement length for the main fin with a cutting line which is maximally spaced among the at least one cutting line, and matching the forward and backward movement length for the auxiliary fin with a remaining cutting line in inverse proportional to the separation distance.

In the embodiment, the matching may include distinguishably mapping the forward and backward movement length for the main fin and the forward and backward movement length for the auxiliary fin by using a resolution grid map in which the at least one cutting line is set to a Y-axis and intervals between the at least one cutting line spaced apart from the one side point are set to a Z-axis.

Advantageous Effects

According to the embodiment of the present invention, it is possible to rapidly and efficiently manufacture a heat sink having heat dissipation area efficiency that is greater than that in the conventional technology.

MODE FOR INVENTION

Figure 1:
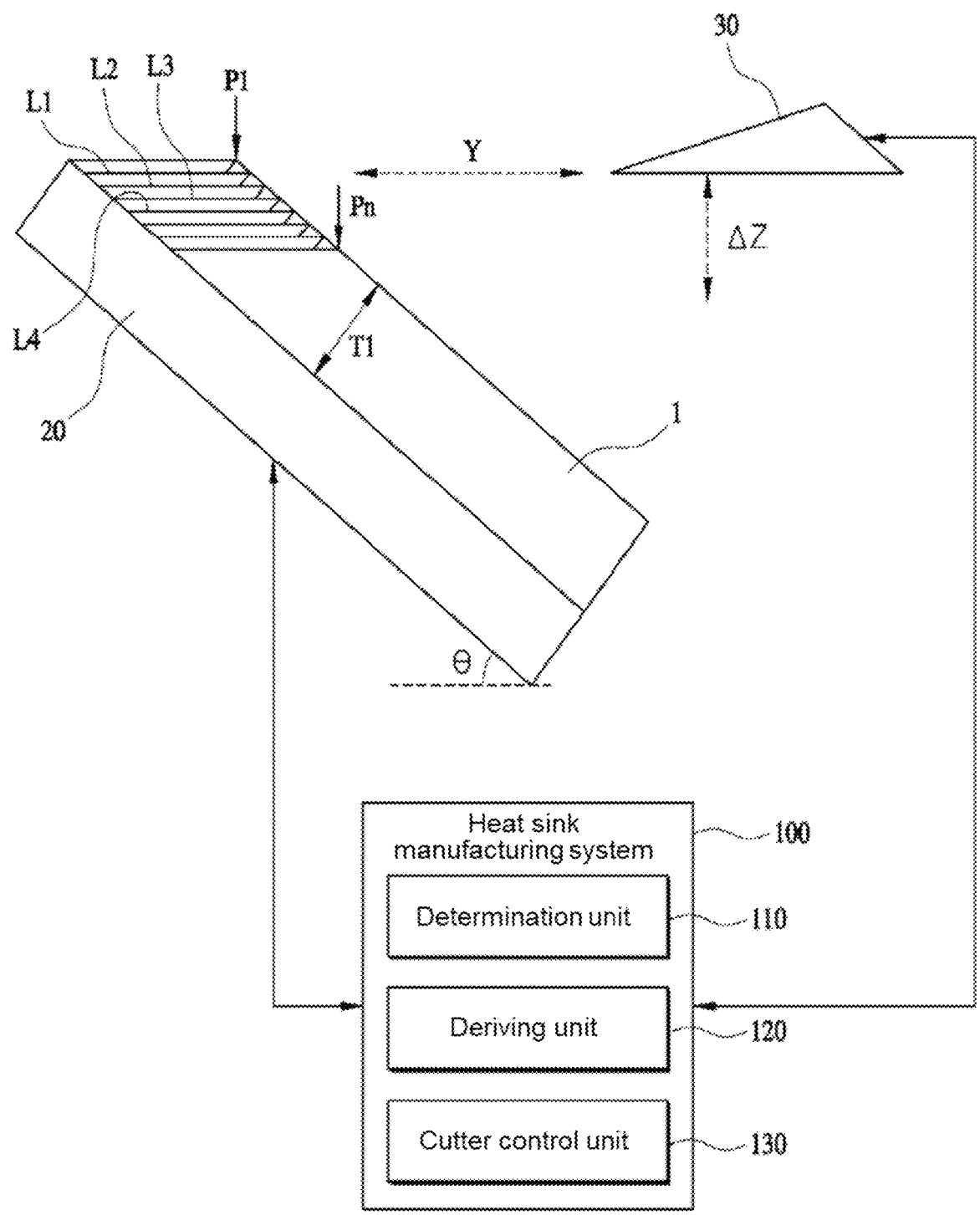
FIG. 1 is a block diagram schematically showing a heat sink manufacturing system 100 according to one embodiment of the present invention.

Hereinafter, the present invention will be described in more detail with reference to the embodiments and drawings of the present invention. The embodiments are only presented exemplarily to describe the present invention in more detail, and it will be apparent to those skilled in the art that the scope of the present invention is not limited by the embodiments.

In addition, unless otherwise defined, all technical and scientific terms used herein have the same meaning as commonly understood by those skilled in the art to which the present invention pertains, and in case of conflict, the description herein including the definition will take precedence.

In order to clearly describe the invention proposed in the drawings, parts not related to the description are omitted, and similar parts are denoted by similar reference numerals throughout the specification. In addition, when one component "includes" some elements, it does not exclude other elements, but may further include the other elements, unless particularly stated otherwise. In addition, the term "unit" described in the specification means one unit or block that performs a specific function.

In each step, the reference numerals (first, second, etc.) are used for convenience of description, and the reference numerals do not describe the order of each step, and each step may be performed differently from the specified order unless the specific order is clearly described in the context. That is, the respective steps may be performed in the same order as described above, may be performed substantially simultaneously, or may be performed in the reverse order.

FIG. 1 is a block diagram schematically showing a heat sink manufacturing system 100 according to one embodiment of the present invention, FIG. 2(a) is a view showing one embodiment of a heat sink 10, FIG. 2(b) is a view showing another embodiment of the heat sink 10, and FIGS. 3(a) and 3(b) are views for explaining operation examples of a skiving cutter 30 of FIG. 1.

Referring to FIGS. 1 to 3(b), the heat sink manufacturing system 100 according to one embodiment of the present invention may include a determination unit 110, a deriving unit 120, and a cutter control unit 130 in order to process a target object 1 by using the skiving cutter 30.

First, the determination unit 110 may determine at least one cutting line (e.g., L1 to L4) positioned along one direction from one side point (e.g., P1) of a processing surface of the target object 1 according to a specific angle section (e.g., θ) formed by the skiving cutter 30 and the processing surface of the target object 1.

At least one cutting line (e.g., L1 to L4) used herein is a vertical line spaced apart from one side point (e.g., P1) of the processing surface at the same interval along one direction (e.g., Z-axis direction), and may be a guide line for moving the skiving cutter 30 forward and backward. In this case, at least one cutting line (e.g., L1 to L4) may be determined to be positioned in parallel to each other along the Z-axis direction.

Further, the determination unit 110 may determine the number (e.g., n+1) of at least one cutting line (e.g., L1 to L4) based on the number (n) of auxiliary fins identified according to a specific shape of the heat sink 10 to be manufactured.

For example, when the number of auxiliary fins identified according to the specific shape of the heat sink 10 to be manufactured is 1, the determination unit 110 may determine the number of at least one cutting line (e.g., L1 to L4) as 2. Further, when the number of auxiliary fins identified according to the specific shape of the heat sink 10 to be manufactured is 3, the determination unit 110 may determine the number of at least one cutting line (e.g., L1 to L4) as 4.

In this case, as shown in FIGS. 2(a) and 2(b), the heat sink 10 may be manufactured in any one specific shape of any one of a Y fin or a tree fin.

For example, when the specific shape of the heat sink 10 to be manufactured is a Y fin, the determination unit 110 may determine the number of auxiliary fins as 1, and when the specific shape of the heat sink 10 to be manufactured is a tree fin, the determination unit 110 may determine the number of auxiliary fins as 3.

The heat sink 10 manufactured in any one specific shape of the Y fin or the tree fin may be coupled to a component or the like that generates heat inside an electric device to efficiently dissipate the heat generated in an element due to air passing between heat dissipation fins or the flow of a fluid for cooling.

That is, as the target object 1 is stacked on a base plate 20, the determination unit 110 may adjust the base plate 20 at a predetermined angle such that the processing surface of the target object 1 is obliquely directed to the skiving cutter 30, and then may determine at least one cutting line (e.g., L1 to L4) positioned along one direction from one side point (e.g., P1) of the processing surface of the target object 1.

The determination unit 110 according to the embodiment may confirm whether the target object 1 is disposed on a stacked surface of the base plate 20 in parallel to the stacked surface of the base plate 20 through a camera (not shown). In this case, the determination unit 110 may adjust the base plate 20 such that the base plate 20 is inclined at a specific angle in order to allow the processing surface of the target object 1 is directed to the skiving cutter 30.

Next, the deriving unit 120 may individually derive a fin-specific forward and backward movement length of the skiving cutter 30, which correspond to a separation distance of at least one cutting line (e.g., L1 to L4) from one side point (e.g., P1), based on manufacturing characteristics of the target object 1 and a manufacturing shape of the heat sink 10.

The fin-specific forward and backward movement length used herein may mean a cutting length of the target object 1 as the skiving cutter 30 moves forward and backward.

For example, when the material property of the target object 1 is copper and the shape of the heat sink 10 is a tree fin, the deriving unit 120 may derive the forward and backward movement length of the skiving cutter 30, which corresponds to a first cutting line spaced apart from one side point (e.g., P1) by 1.5 mm, as 10 mm, may derive the forward and backward movement length of the skiving cutter 30, which corresponds to a second cutting line spaced apart from one side point (e.g., P1) by 3.0 mm, as 7 mm, may derive the forward and backward movement length of the skiving cutter 30, which corresponds to a third cutting line spaced apart from one side point (e.g., P1) by 4.5 mm, as 4 mm, and may derive the forward and backward movement length of the skiving cutter 30, which corresponds to a fourth cutting line spaced apart from one side point (e.g., P1) by 6.0 mm, as 12 mm. Hereinafter, the deriving unit 120 will be described in more detail with reference to FIGS. 4 to 6.

Next, the cutter control unit 130 may sequentially move the skiving cutter 30 forward and backward along at least one cutting line (e.g., L1 to L4) based on the fin-specific forward and backward movement length to separate at least one auxiliary fin 12_1 to 12_N and one main fin 11 from the target object 1.

That is, as shown in FIGS. 3a and 3b, the cutter control unit 130 may form at least one auxiliary fin (12_1 to 12_N) and one main fin 11 with respect to the target object 1 by using the skiving cutter 30 that moves according to the fin-specific forward and backward movement length.

Thereafter, the cutter control unit 130 may process one main pin 11 using the skiving cutter 30 such that one main fin 11 stands upright with respect to the base plate 20 on which the target object 1 is stacked, so as to manufacture the heat sink 10 formed in a shape of a plurality of fins branching upward from one main fin 11.

That is, the cutter control unit 130 may allow one main fin 11 to stand upright, thereby manufacturing the heat sink 10 having a tree fin or Y fin shape.

The heat sink manufacturing system 100 according to the embodiment of the present invention may be sequentially operated according to a predetermined heat sink manufacturing order through the determination unit 110, the deriving unit 120, and the cutter control unit 130 to support rapid and effective manufacturing of the heat sink 10 having higher heat dissipation efficiency.

Hereinafter, the configuration of the present invention and the effects thereof will be described in more detail with reference to specific examples and comparative examples. However, the present embodiment is intended to describe the present invention in more detail, and the scope of the present invention is not limited to these embodiments.

Figure 4:
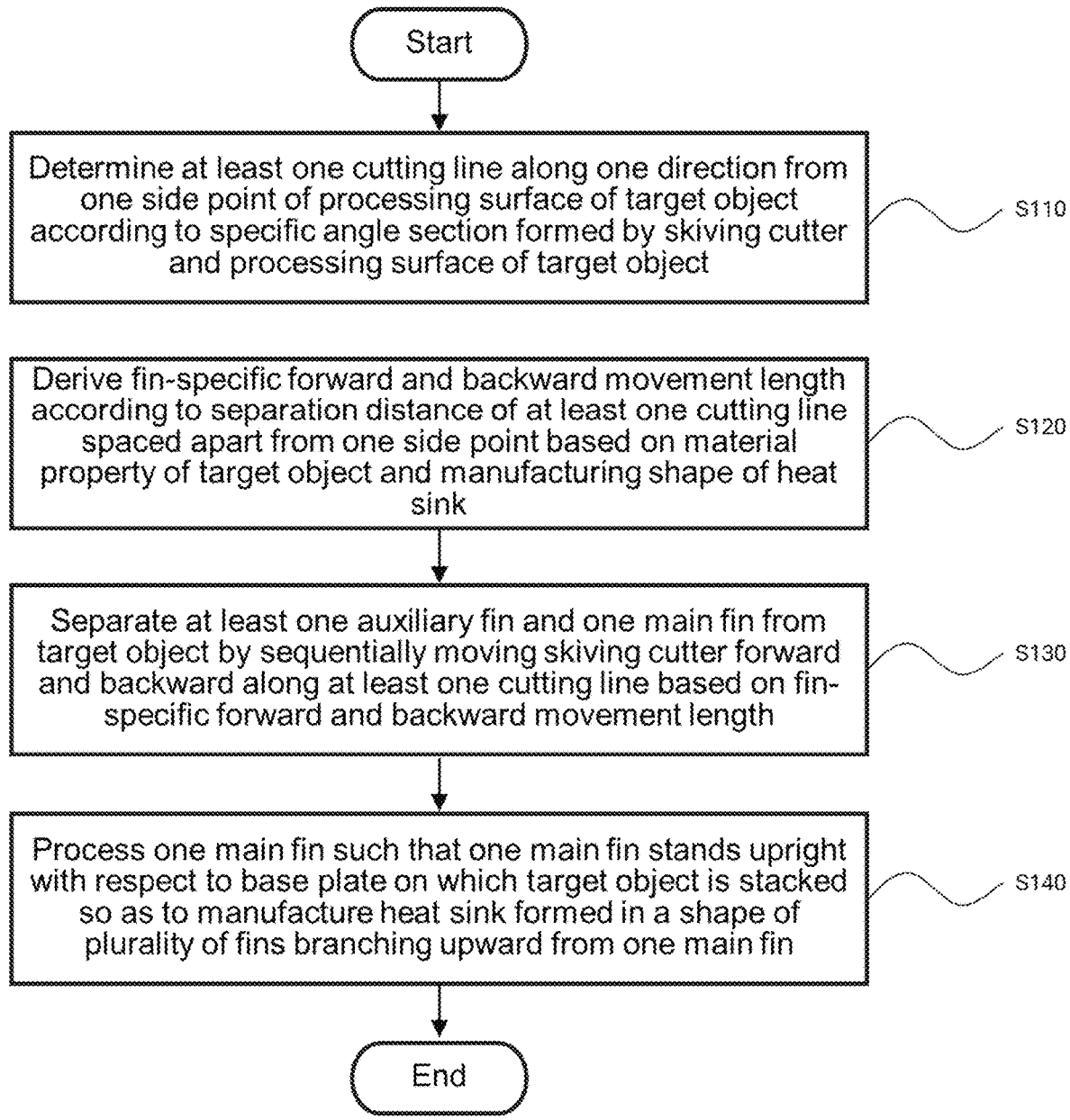
FIG. 4 is an operation process of the heat sink manufacturing system 100 of FIG. 1.

FIG. 4 is an operation process of the heat sink manufacturing system 100 of FIG. 1.

Referring to FIGS. 1 to 4, in step S110, first, the determination unit 110 may determine at least one cutting line (e.g., L1 to L4) along one direction from one side point (e.g., P1) of the processing surface of the target object 1 according to the specific angle section (e.g., θ) formed by the skiving cutter 30 and the processing surface of the target object 1.

According to one embodiment, the determination unit 110 may confirm whether the target object 1 is disposed on the stacked surface of the base plate 20 in parallel to the stacked surface of the base plate 20 through a camera (not shown) before step S110. In this case, the determination unit 110 may adjust the base plate 20 such that the base plate 20 is inclined at a specific angle in order to allow the processing surface of the target object 1 is directed to the skiving cutter 30.

According to another embodiment, the determination unit 110 may determine the number (e.g., n+1) of at least one cutting line (e.g., L1 to L4) based on the number (n) of auxiliary fins identified according to a specific shape of the heat sink 10 to be manufactured.

For example, when the heat sink 10 is selected to be manufactured in a tree fin shape, the determination unit 110 may determine the number (n+1) of at least one cutting line (e.g., L1 to L4) as 4 based on the number of auxiliary fins of 3, which is identified according to the tree fin shape.

Thereafter, in step S120, the deriving unit 120 may individually derive a fin-specific forward and backward movement length of the skiving cutter 30 according to a separation distance of at least one cutting line (e.g., L1 to L4) from one side point (e.g., P1), based on manufacturing characteristics of the target object 1 and a manufacturing shape of the heat sink 10.

Next, in step S130, the cutter control unit 130 may sequentially move the skiving cutter 30 forward and backward along at least one cutting line (e.g., L1 to L4) based on the fin-specific forward and backward movement length to separate at least one auxiliary fin 12_1 to 12_N and one main fin 11 from the target object 1.

Thereafter, in step S140, the cutter control unit 130 may process one main pin 11 using the skiving cutter 130 such that one main fin 11 stands upright with respect to the base plate 20 on which the target object 1 is stacked, so as to manufacture the heat sink 10 formed in a shape of a plurality of fins branching upward from one main fin 11, for example, in a tree fin or Y fin shape.

Figure 5:
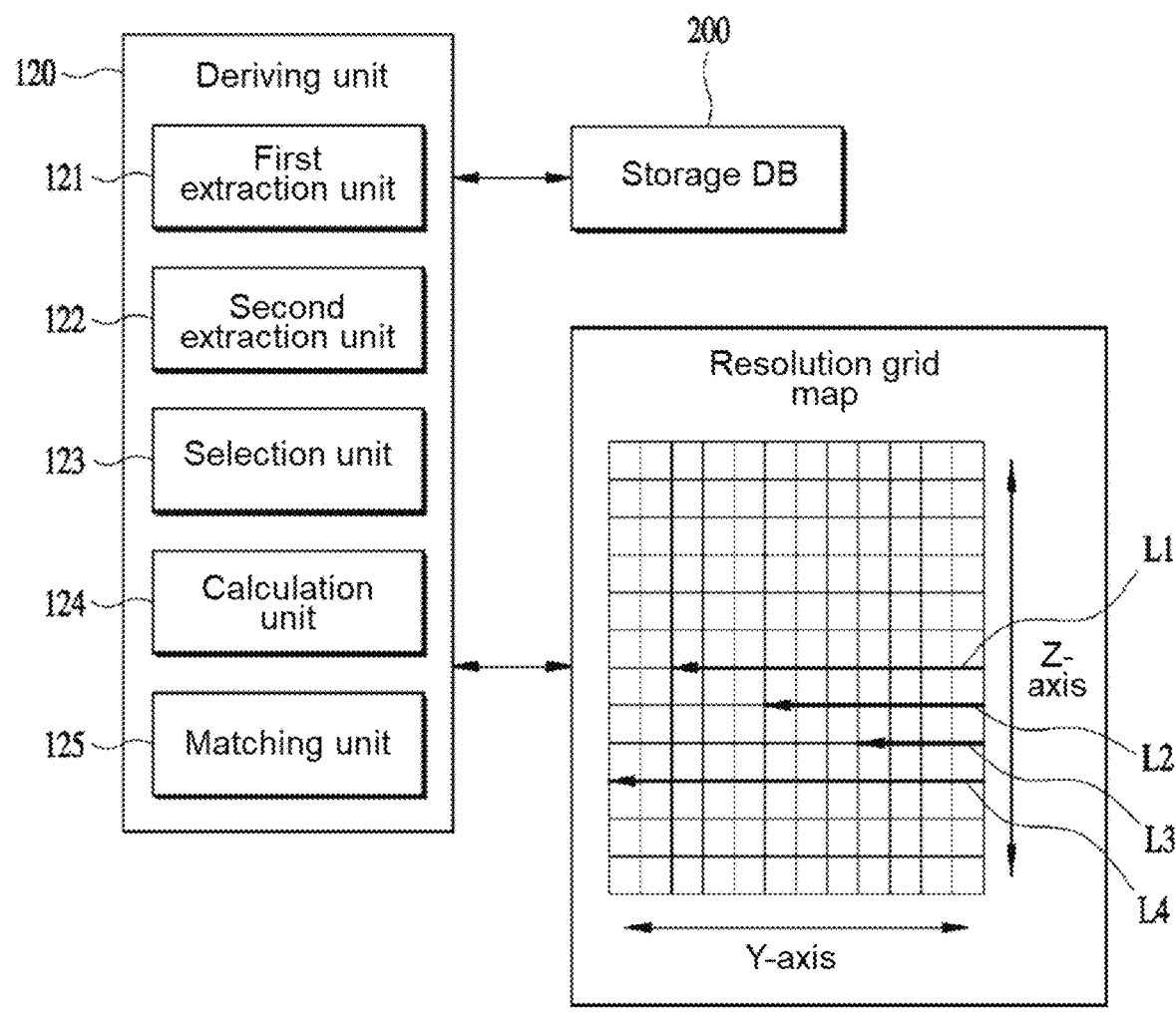
FIG. 5 is a block diagram showing a deriving unit 120 of FIG. 1 in more detail.
Figure 6:
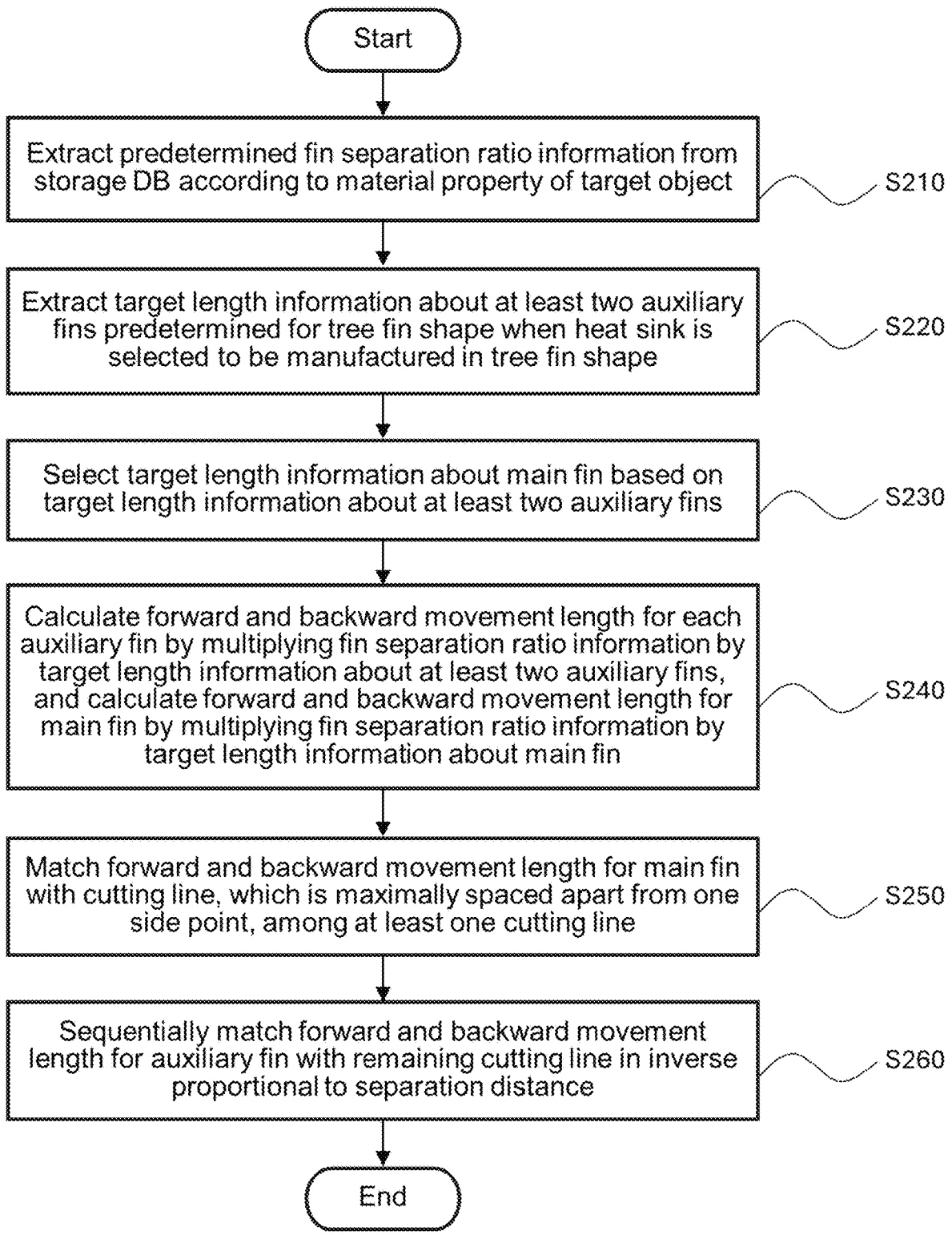
FIG. 6 is an operation process of the deriving unit 120 of FIG. 5.

FIG. 5 is a block diagram showing a deriving unit 120 of FIG. 1 in more detail, and FIG. 6 is an operation process of the deriving unit 120 of FIG. 5.

Referring to FIGS. 5 and 6, the deriving unit 120 may include first and second extraction units 121 and 122, a selection unit 123, a calculation unit 124, and a matching unit 125.

First, in step S210, the first extraction unit 121 may extract fin separation ratio information from a storage DB 200 according to the material property of the target object 1.

The fin separation ratio information used herein is values obtained by digitizing a ratio of an actual separation area to a total cutting area of the target object 1 to be cut by the skiving cutter 30 according to the material property through an experiment, and may be classified and managed for each material in the storage DB 200.

For example, the fin separation ratio information of the material property corresponding to copper may correspond to 1.8, and the fin separation ratio information of the material property corresponding to aluminum may correspond to 2.0.

Next, in step S220, when the heat sink 10 is selected to be manufactured in a tree fin shape, the second extraction unit 122 may extract target length information about at least two auxiliary fins predetermined for a tree fin shape from the storage DB 200. For example, when the heat sink 10 is selected to be manufactured in a tree fin shape including the first to third auxiliary fins 12_1 to 12_3, the second extraction unit 122 may extract predetermined target length information about at least two auxiliary fins from the storage DB 200 as 5.5 mm, 3.9 mm, and 2.2 mm.

Next, in step S230, the selection unit 123 may select target length information about the main fin based on the target length information about at least two auxiliary fins.

In this case, the target length information about the main fin may be selected to be greater than the target length information about at least two auxiliary fins. For example, when the target length information about at least two auxiliary fins is 5.5 mm, 3.9 mm, and 2.2 mm, the selection unit 123 may select the target length information about the main pin as a 6.6 mm that is greater than the target length information about at least two auxiliary pins.

Thereafter, in step S240, the calculation unit 124 may calculate a forward and backward movement length for each auxiliary fin by multiplying the predetermined fin separation ratio information by the target length information about at least two auxiliary fins. In addition, the calculation unit 124 may simultaneously calculate the forward and backward movement length for the main fin by multiplying the fin separation ratio information by the target length information about the main fin.

Specifically, when the specific shape of the heat sink 10 to be manufactured corresponds to a tree fin shape, the calculation unit 124 may calculate a first forward and backward movement length of the skiving cutter 30 with respect to the first auxiliary pin 12_1 by multiplying target length information about the first auxiliary fin 12_1 among at least one auxiliary fins 12_1 to 12_N by the fin separation ratio information. For example, when the fin separation ratio information is 1.8 and the target length information about the first auxiliary fin 12_1 is 5.5 mm, the calculation unit 124 may calculate the first forward and backward movement length as 10 mm.

Moreover, the calculation unit 124 may calculate a second forward and backward movement length of the skiving cutter 30 with respect to the second auxiliary pin 12_2 by multiplying target length information about the second auxiliary fin 12_2 among at least one auxiliary fins 12_1 to 12_N by the fin separation ratio information. For example, when the fin separation ratio information is 1.8 and the target length information about the second auxiliary fin 12_2 is 3.9 mm, the calculation unit 124 may calculate the second forward and backward movement length as 7 mm.

Moreover, the calculation unit 124 may calculate a third forward and backward movement length of the skiving cutter 30 with respect to the third auxiliary pin 12_3 by multiplying target length information about the third auxiliary fin 12_3 among at least one auxiliary fins 12_1 to 12_N by the fin separation ratio information. For example, when the fin separation ratio information is 1.8 and the target length information about the third auxiliary fin 12_3 is 2.2 mm, the calculation unit 124 may calculate the third forward and backward movement length as 4 mm.

In this case, the calculation unit 124 may calculate a fourth forward and backward movement length of the skiving cutter 30 with respect to the main fin 11 by multiplying the target length information about the main fin 11 by the fin separation ratio information. For example, when the fin separation ratio information is 1.8 and the target length information about the main fin 11 is 6.6 mm, the calculation unit 124 may calculate the fourth forward and backward movement length as 12 mm.

According to the embodiment, when the specific shape of the heat sink 10 to be manufactured corresponds to a Y fin shape, the calculation unit 124 may skip the step of calculating the second and third forward and backward movement lengths from among the first to fourth forward and backward movement lengths.

Thereafter, in S250, the matching unit 125 may match the forward and backward movement length of the main fin with the cutting line (e.g., L4), which is maximally spaced apart from one side point (e.g., P1), among at least cutting line (e.g., L1 to L4) through the calculation unit 124. For example, the matching unit 125 may match the forward and backward movement length (12 mm) for the main fin with a maximum separation distance (6.0 mm) of at least one cutting line (e.g., L1 to L4).

Thereafter, the matching unit 125 may sequentially match the forward and backward movement length for the auxiliary fin with a remaining cutting line (e.g., L1 to L3) among at least one cutting line (e.g., L1 to L4) in inverse proportional to the separation distance. For example, the matching unit 125 may match the forward and backward movement length (55 mm: 3.9 mm: 2.2 mm) for the auxiliary fin with the remaining cutting line (e.g., L1 to L3) in inverse proportional to a remaining separation distance (1.5 mm: 3.0 mm: 4.5 mm).

According to the embodiment, the matching unit 125 may manage the forward and backward movement length of the main fin and the forward and backward movement length of the auxiliary fin by distinguishing mapping the same with a grid length by using a resolution grid map in which at least one cutting line (e.g., L1 to L4) is set to a Y-axis and intervals between at least one cutting line (e.g., L1 to L4) separated from one side point (e.g., P1) are set to a Z-axis.

Figure 7:
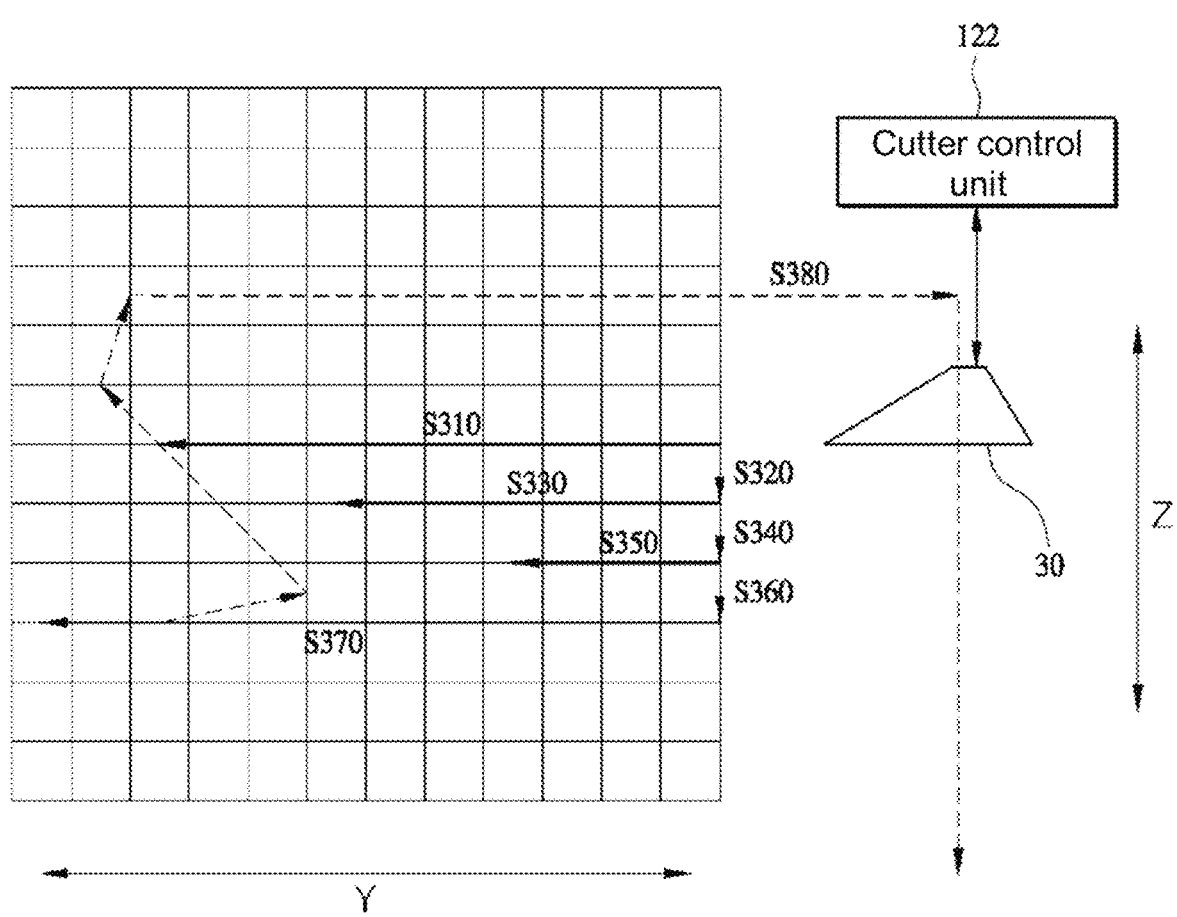
FIG. 7 is an operation process of a cutter control unit 120 for processing the heat sink 10 having a tree fin shape.

FIG. 7 is an operation process of the cutter control unit 120 for processing the heat sink 10 having a tree fin shape.

Figure 2:
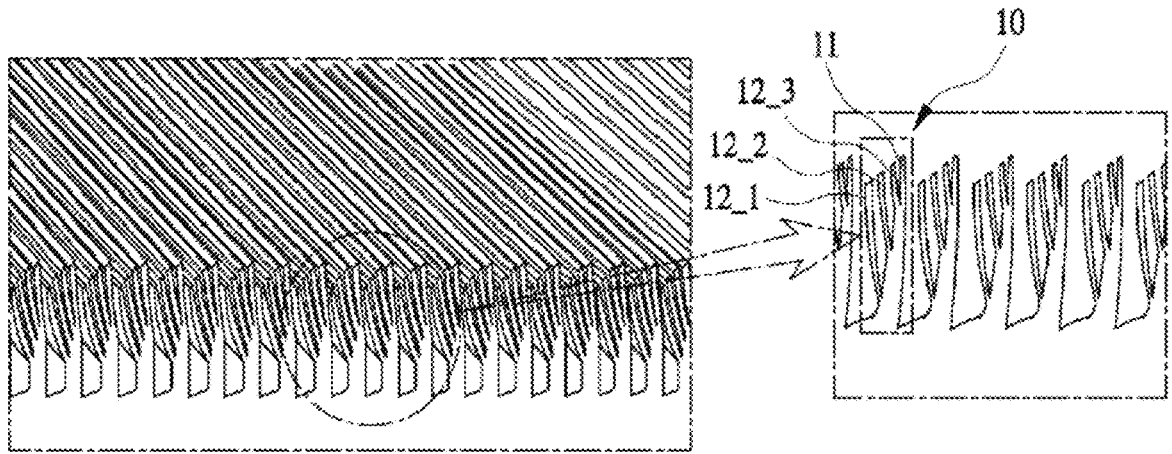
FIG. 2(a) is a view showing one embodiment of a heat sink 10.
FIG. 2(b) is a view showing another embodiment of the heat sink 10.
Figure 2:
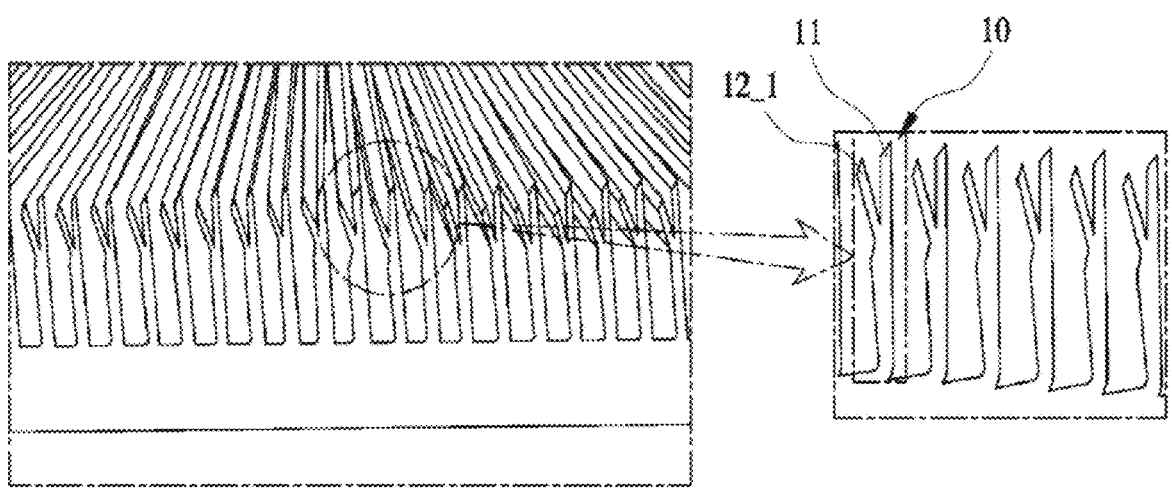
Figure 3:
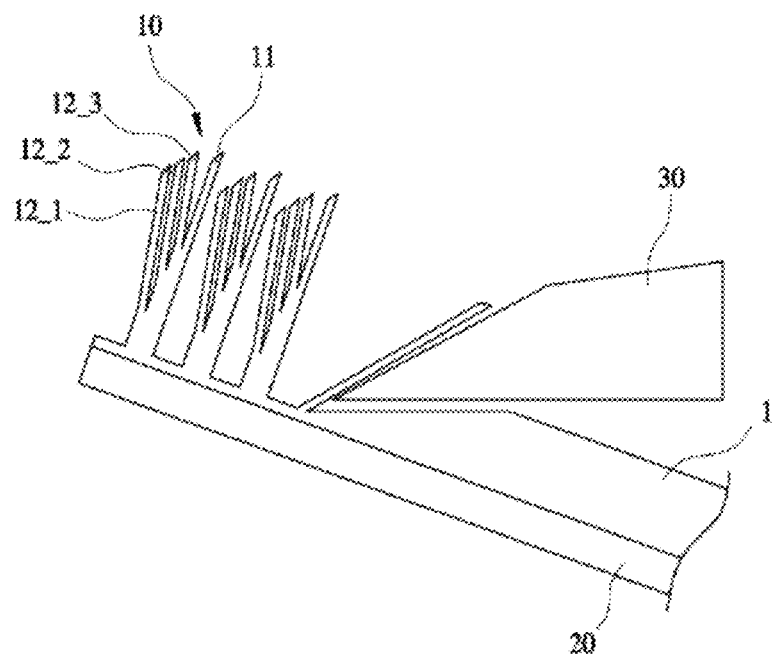
FIGS. 3(a) and 3(b) are views for explaining operation examples of a skiving cutter 30 of FIG. 1.
Figure 3:
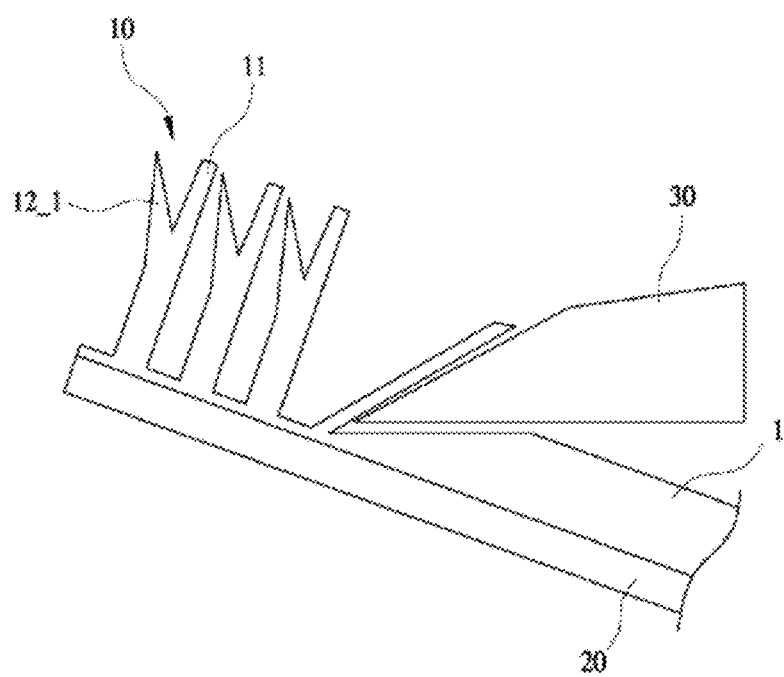

Referring to FIGS. 1, 2(*a*), and 7, first, in step S310, the cutter control unit 130 may allow the skiving cutter to move forward and backward in a Y-axis direction by the first forward and backward movement length (e.g., Y1 to Y10.5), which is derived through the deriving unit 120, from grid coordinates (e.g., Z7, Y1) of the first cutting line confirmed through the resolution grid map. In this case, the first auxiliary fin (e.g., 12_1 of FIG. 2(*a*)) may be separated from the target object 1.

Next, in step S320, the cutter control unit 130 may move the skiving cutter in a Z-axis direction from grid coordinates (e.g., Z8, Y1) of the second cutting line confirmed through the resolution grid map.

Next, in step S330, the cutter control unit 130 may allow the skiving cutter to move forward and backward in the Y-axis direction by the second forward and backward movement length (e.g., Y1 to Y7.5), which is derived through the deriving unit 120, from grid coordinates (e.g., Z8, Y1) of the second cutting line confirmed through the resolution grid map. In this case, the second auxiliary fin (e.g., 12_2 of FIG. 2(*a*)) may be separated from the target object 1.

Next, in step S340, the cutter control unit 130 may move the skiving cutter in the Z-axis direction from grid coordinates (e.g., Z9, Y1) of the third cutting line confirmed through the resolution grid map.

Next, in step S350, the cutter control unit 130 may allow the skiving cutter to move forward and backward in the Y-axis direction by the third forward and backward movement length (e.g., Y1 to Y4.5), which is derived through the deriving unit 120, from grid coordinates (e.g., Z9, Y1) of the third cutting line confirmed through the resolution grid map. In this case, the third auxiliary fin (e.g., 12_3 of FIG. 2(*a*)) may be separated from the target object 1.

Next, in step S360, the cutter control unit 130 may move the skiving cutter in the Z-axis direction from grid coordinates (e.g., Z10, Y1) of the fourth cutting line confirmed through the resolution grid map.

Next, in step S370, the cutter control unit 130 may allow the skiving cutter to move forward and backward in the Y-axis direction by the fourth forward and backward movement length (e.g., Y1 to Y12.5), which is derived through the deriving unit 120, from grid coordinates (e.g., Z10, Y1) of the fourth cutting line confirmed through the resolution grid map. In this case, the fourth auxiliary fin (e.g., 11 of FIG. 2(*a*)) may be separated from the target object 1.

Thereafter, in step S380, the cutter control unit 130 may process the main fin (for example, 11 of FIG. 2(*a*)) such that the main fin stands upright, thereby manufacturing the heat sink 10 of a tree fin shape.

In the present specification, only few examples of various embodiments performed by the present inventors have been described, but the technical idea of the present invention is not limited thereto, and may be modified by those skilled in the art to be variously performed.

The invention claimed is:

1. A method for manufacturing a heat sink for processing a target object using a skiving cutter, the method comprising:

determining, based on information about an angle formed by the skiving cutter and a processing surface of the target object, at least one cutting line along one direction from one side point of the processing surface;

individually deriving, based on material properties of the target object and a shape of the heat sink to be manufactured, fin-specific forward and backward movement lengths of the skiving cutter according to a separation distance of the at least one cutting line from the one side point; and separating, based on the fin-specific forward and backward movement lengths, at least one auxiliary fin and at least one main fin from the target object by sequentially moving the skiving cutter forward and backward along the at least one cutting line, wherein the at least one auxiliary fin is formed by processing the at least one main fin such that the at least one min main fin stands upright with respect to a base plate on which the target object is stacked, so as to manufacture the heat sink formed with the at least one main fin and the at least one auxiliary fin branching upward from the at least one main fin, wherein the deriving includes:

extracting predetermined fin separation ratio information according to the material properties of the target object;

extracting target length information about at least two auxiliary fins such that the heat sink has a tree fin shape;

selecting target length information about the at least one main fin based on the target length information about the at least two auxiliary fins;

calculating a forward and backward movement length for an auxiliary fin by multiplying the fin separation-ratio information by the target length information about the at least two auxiliary fins, and calculating a forward and backward movement length of the at least one main fin by multiplying the fin separation ratio information by the target length information about the at least one main fin; and matching the forward and backward movement length for the at least one main fin with a cutting line which is maximally spaced apart from one side point (P1) among the at least one cutting line, and matching the forward and backward movement length for the auxiliary fin with a remaining cutting line in inverse proportional to the separation distance.

2. The method of claim 1, wherein the determining includes:

confirming whether the target object is disposed on a stacked surface of the base plate in parallel to the stacked surface of the base plate through a camera; and adjusting the base plate such that the base plate is inclined at a specific angle in order to allow the processing surface of the target object to be directed to the skiving cutter.

3. The method of claim 1, wherein the determining includes determining a number of the at least one cutting line based on a number of auxiliary fins identified according to a specific shape of the heat sink to be manufactured.

4. The method of claim 1, wherein the matching includes distinguishably mapping the forward and backward movement length for the at least one main fin and the forward and backward movement length for the at least two auxiliary fins auxiliary fin by using a resolution grid map in which the at least one cutting line is set to a Y-axis and intervals between the at least one cutting line spaced apart from the one side point are set to a Z-axis.

* * * * *